US012573592B2

(12) United States Patent
Todo

(10) Patent No.: US 12,573,592 B2
(45) Date of Patent: Mar. 10, 2026

(54) PLASMA PROCESSING METHOD AND PLASMA PROCESSING APPARATUS

(71) Applicant: Tokyo Electron Limited, Minato-ku (JP)

(72) Inventor: Soya Todo, Boise, ID (US)

(73) Assignee: Tokyo Electron Limited, Minato-ku (JP)

( * ) Notice: Subject to any disclaimer, the term of this patent is extended or adjusted under 35 U.S.C. 154(b) by 207 days.

(21) Appl. No.: 18/464,041

(22) Filed: Sep. 8, 2023

(65) Prior Publication Data

US 2023/0420223 A1 Dec. 28, 2023

Related U.S. Application Data

(63) Continuation of application No. PCT/JP2022/009306, filed on Mar. 4, 2022.

(30) Foreign Application Priority Data

Mar. 9, 2021 (JP) ................................. 2021-037155

(51) Int. Cl.
*H01J 37/32* (2006.01)
(52) U.S. Cl.
CPC .... *H01J 37/3244* (2013.01); *H01J 37/32165* (2013.01); *H01J 37/32174* (2013.01); *H01J 37/32568* (2013.01); *H01J 2237/334* (2013.01)

(58) Field of Classification Search
None
See application file for complete search history.

(56) References Cited

U.S. PATENT DOCUMENTS

2020/0251345 A1* 8/2020 Yin ................... H01L 21/31116

FOREIGN PATENT DOCUMENTS

| JP | H09-120957 A | 5/1997 |
| JP | 2016-157735 A | 9/2016 |
| JP | 2020-126998 A | 8/2020 |
| WO | 2019/244734 A | 12/2019 |

* cited by examiner

*Primary Examiner* — Shamim Ahmed
(74) *Attorney, Agent, or Firm* — PROCOPIO, CORY, HARGREAVES & SAVITCH LLP

(57) ABSTRACT

The present disclosure provides a substrate processing technology with good in-plane uniformity. A plasma processing method according to the present disclosure includes: disposing a substrate on a substrate support, supplying a processing gas, into the chamber, for processing the substrate, forming a plasma of the processing gas between the upper electrode and the lower electrode by supplying a first RF having a first frequency to an upper electrode or a lower electrode, and controlling an electric field formed between the upper electrode or the lower electrode and the plasma by supplying a second RF having a second frequency lower than the first frequency to the upper electrode or the lower electrode, in which the step of forming the plasma includes controlling the supply of the first RF based on a phase of the second RF.

10 Claims, 6 Drawing Sheets

PLASMA PROCESSING METHOD AND PLASMA PROCESSING APPARATUS

CROSS-REFERENCE TO RELATED APPLICATION

This application is a bypass continuation of International Patent Application PCT/JP2022/009306, filed Mar. 4, 2022, which claims benefit of priority from Japanese Patent Application 2021-037155, filed Mar. 9, 2021, the contents of both of which are incorporated herein by reference.

BACKGROUND

Field

Exemplary embodiments of the present disclosure relate to a plasma processing method and a plasma processing apparatus.

Description of Related Art

As a related art, there is a plasma processing method described in Japanese Patent Application Laid-Open No. 2016-157735.

SUMMARY

In one exemplary embodiment of the present disclosure, a plasma processing method for performing plasma processing to a substrate in a plasma processing apparatus is provided. The plasma processing apparatus includes a chamber, a substrate support that is provided in the chamber, includes a lower electrode, and is configured to support the substrate, and an upper electrode that is provided in the chamber to face the lower electrode, the substrate support being provided between the upper electrode and the lower electrode, the plasma processing method includes: disposing a substrate on the substrate support, supplying a processing gas, into the chamber, for processing the substrate, forming a plasma of the processing gas between the upper electrode and the lower electrode by supplying a first RF having a first frequency to the upper electrode or the lower electrode, and controlling an electric field formed between the upper electrode or the lower electrode and the plasma by supplying a second RF having a second frequency lower than the first frequency to the upper electrode or the lower electrode, in which the step of forming the plasma includes controlling the supply of the first RF based on a phase of the second RF.

In one exemplary embodiment of the present disclosure, a plasma processing apparatus that performs plasma processing to a substrate is provided. The plasma processing apparatus includes a chamber, a substrate support that is provided in the chamber, includes a lower electrode, and is configured to support the substrate, an upper electrode that is provided in the chamber to face the lower electrode, the substrate support being provided between the upper electrode and the lower electrode, and a controller, wherein the controller executes a control of disposing a substrate on the substrate support, supplying a processing gas, into the chamber, for processing the substrate, forming a plasma of the processing gas between the upper electrode and the lower electrode by supplying a first RF having a first frequency to the upper electrode or the lower electrode, controlling an electric field formed between the upper electrode or the lower electrode and the plasma by supplying a second RF having a second frequency lower than the first frequency to upper electrode or the lower electrode, and controlling the supply of the first RF based on a phase of the second RF in the forming of the plasma.

DETAILED DESCRIPTION

Figure 1:
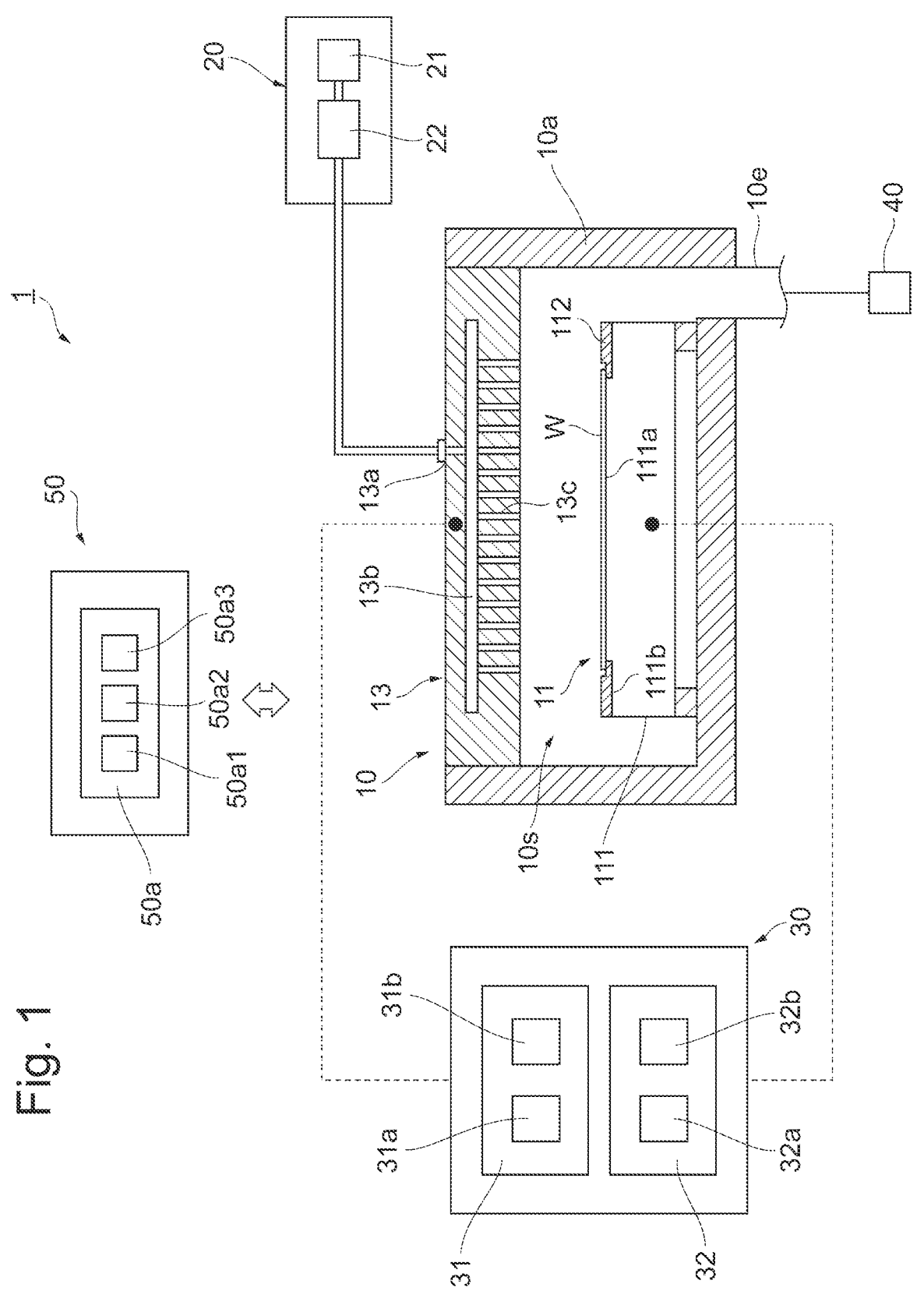
FIG. 1 is a diagram schematically illustrating a substrate processing apparatus 1 according to one exemplary embodiment.

Hereinafter, each embodiment of the present disclosure will be described.

In one exemplary embodiment, a plasma processing method for performing plasma processing to a substrate in a plasma processing apparatus is provided. The plasma processing apparatus includes a chamber, a substrate support that is provided in the chamber, includes a lower electrode, and is configured to support the substrate, and an upper electrode that is provided in the chamber to face the lower electrode, the substrate support being provided between the upper electrode and the lower electrode, the plasma processing method includes disposing a substrate on the substrate support, supplying a processing gas, into the chamber, for processing the substrate, forming a plasma from the processing gas between the upper electrode and the lower electrode by supplying a first RF having a first frequency to the upper electrode or the lower electrode, and controlling an electric field formed between the upper electrode or the lower electrode and the plasma by supplying a second RF having a second frequency lower than the first frequency to the upper electrode or the lower electrode, in which the step of forming the plasma includes controlling the supply of the first RF based on a phase of the second RF.

In one exemplary embodiment, controlling the supply of the first RF includes forming a plasma by supplying the first RF to the upper form or the lower electrode with a first power, and suppressing the forming of the plasma by supplying the first RF to the upper electrode or the lower electrode with a second power lower than the first power based on a phase of the second RF.

In one exemplary embodiment, in suppressing the forming of the plasma, when the phase of the second RF is in one or more predetermined phase ranges, the first RF is supplied to the upper electrode or the lower electrode with the second power.

In one exemplary embodiment, the one or more predetermined phase ranges are based on a thickness of a sheath formed between the upper electrode or the lower electrode and the plasma, at which the sheath resonates with the chamber.

In one exemplary embodiment, in suppressing the forming of the plasma, the first RF is supplied with a second power in two of the predetermined phase ranges.

In one exemplary embodiment, the plasma processing apparatus includes a controller, the plasma processing method further includes storing one or more predetermined phase ranges in the controller, and in controlling the supply of the first RF, the supply of the first RF is controlled based on the one or more predetermined phase ranges stored in the controller.

In one exemplary embodiment, the plasma processing method further includes calculating a reactance of the chamber with respect to a harmonic of the first RF, and calculating the one or more predetermined phase ranges based on the calculated reactance, in which in the step of controlling the supply of the first RF, the supply of the first RF is controlled based on the calculated one or more predetermined phase ranges.

In one exemplary embodiment of the present disclosure, a plasma processing apparatus that performs plasma processing to a substrate is provided. The plasma processing apparatus includes a chamber, a substrate support that is provided in the chamber, includes a lower electrode, and is configured to support the substrate, an upper electrode that is provided in the chamber to face the lower electrode, the substrate support being provided between the upper electrode and the lower electrode, and a controller, wherein the controller executes a control of disposing a substrate on the substrate support, supplying a processing gas, into the chamber, for processing the substrate, forming a plasma from the processing gas between the upper electrode and the lower electrode by supplying a first RF having a first frequency to the upper electrode or the lower electrode, controlling an electric field formed between the upper electrode or the lower electrode and the plasma by supplying a second RF having a second frequency lower than the first frequency to upper electrode or the lower electrode, and controlling the supply of the first RF based on a phase of the second RF in the forming of the plasma.

Hereinafter, each embodiment of the present disclosure will be described in detail with reference to drawings. In each drawing, the same or similar elements will be given the same reference numerals, and repeated descriptions will be omitted. Unless otherwise specified, a positional relationship such as up, down, left, and right will be described based on the positional relationship illustrated in the drawings. The dimensional ratio in the drawings does not indicate an actual ratio, and the actual ratio is not limited to the ratio illustrated in the drawings.

FIG. 1 is a diagram schematically illustrating the substrate processing apparatus 1 according to an exemplary embodiment. The substrate processing apparatus 1 is a capacitively coupled plasma processing apparatus. The substrate processing apparatus 1 includes the plasma processing chamber 10, a gas supply a power source 30, an exhaust system 40, and a controller 50. In addition, the substrate processing apparatus 1 includes a substrate support 11 and a gas introduction. The gas introduction is configured to introduce at least one processing gas into the plasma processing chamber 10. The gas introduction includes a shower head 13. The substrate support 11 is disposed in the plasma processing chamber 10. The shower head 13 is disposed above the substrate support 11. In one exemplary embodiment, the shower head 13 constitutes at least a part of a ceiling of the plasma processing chamber 10. The plasma processing chamber 10 includes a plasma processing space 10s defined by the shower head 13, a side wall of the plasma processing chamber 10, and the substrate support 11. The plasma processing chamber 10 includes at least one gas supply port for supplying at least one processing gas to the plasma processing space 10s, and at least one gas exhaust port for exhausting the gas from the plasma processing space. The side wall 10a is grounded. The shower head 13 and the substrate support 11 are electrically insulated from the plasma processing chamber 10 housing.

The substrate support 11 includes a main body 111 and a ring assembly 112. The main body 111 includes a central region (substrate support surface) 111a for supporting a substrate (wafer) W and an annular region (ring support surface) 111b for supporting the ring assembly 112. The annular region 111b of the main body 111 surrounds the central region 111a of the main body 111 in a plan view. The substrate W is disposed on the central region 111a of the main body 111, and the ring assembly 112 is disposed on the annular region 111b of the main body 111 so as to surround the substrate W on the central region 111a of the main body 111. In one exemplary embodiment, the main body 111 includes a base and an electrostatic chuck. The base includes a conductive member. The conductive member of the base functions as a lower electrode. The electrostatic chuck is disposed on the base. The upper surface of the electrostatic chuck includes the substrate support surface 111a. The ring assembly 112 includes one or more annular members. At least one of the one or more annular members is an edge ring. In addition, although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid such as brine or a gas flows in the flow path. Further, the substrate support 11 may include a heat transfer gas supply configured to supply a heat transfer gas between the back surface and the substrate support surface 111a of the substrate W.

The shower head 13 is configured to introduce at least one processing gas from the gas supply 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. In addition, the shower head 13 includes a conductive member. The conductive member of the shower head 13 functions as an upper electrode. The gas introduction may include one or more side gas injectors (SGI) attached to one or more openings formed on the side wall 10a in addition to the shower head 13.

The gas supply 20 may include at least one gas source 21 and at least one flow rate controller 22. In one exemplary embodiment, the gas supply 20 is configured to supply at least one processing gas from the gas source 21 corresponding to each of the gases to the shower head 13 via the flow rate controller 22 corresponding to each of the gas sources. Each flow rate controller 22 may include, for example, a mass flow controller or a pressure-controlled flow rate controller. Further, the gas supply 20 may include one or more flow rate modulation devices that modulate or pulse the flow rate of at least one processing gas.

The power source 30 includes an RF power source 31 coupled to the plasma processing chamber 10 via at least one impedance matching circuit. The RF power source 31 is configured to supply at least one RF signal (RF power) such as a source RF signal and a bias RF signal to the conductive member of the substrate support 11 and/or the conductive member of the shower head 13. As a result, a plasma is formed from at least one processing gas supplied to the plasma processing space 10s. Therefore, the RF power source 31 may function as at least a part of a plasma generator configured to form a plasma from one or more processing gases in the plasma processing chamber 10. Further, by supplying the bias RF signal to the conductive member of the substrate support 11, a bias potential is generated in the substrate W, and ionic components in the formed plasma can be drawn into the substrate W.

In one exemplary embodiment, the RF power source 31 includes a first RF generator 31a and a second RF generator 31b. The first RF generator 31a is configured to be coupled to the conductive member of the substrate support 11 and/or the conductive member of the shower head 13 via at least one impedance matching circuit to generate a source RF signal (source RF power) for forming a plasma. In one exemplary embodiment, the source RF signal has a frequency in the range of 13 MHz to 150 MHz. In one exemplary embodiment, the first RF generator 31a may be configured to generate a plurality of source RF signals having different frequencies. The generated one or more source RF signals are supplied to the conductive member of the substrate support 11 and/or the conductive member of the shower head 13. The second RF generator 31b is configured to be coupled to the conductive member of the substrate support 11 via at least one impedance matching circuit to generate a bias RF signal (bias RF power). In one exemplary embodiment, the bias RF signal has a lower frequency than the source RF signal. In one exemplary embodiment, the bias RF signal has a frequency in the range of 400 kHz to 13.56 MHz. In one exemplary embodiment, the second RF generator 31b may be configured to generate a plurality of bias RF signals having different frequencies. The generated one or more bias RF signals are supplied to the conductive member of the substrate support 11. In addition, in various embodiments, at least one of the source RF signal and the bias RF signal may be pulsed. Further, in one exemplary embodiment, the source signal and/or the bias RF signal may be applied to another electrode such as an electrode in the electrostatic chuck.

Further, the power source 30 may include a DC power source 32 coupled to the plasma processing chamber 10. The DC power source 32 includes a first DC generator 32a and a second DC generator 32b. In one exemplary embodiment, the first DC generator 32a is configured to be connected to the conductive member of the substrate support 11 to generate a first DC signal. The generated first bias DC signal is applied to the conductive member of the substrate support 11. In one exemplary embodiment, the first DC signal may be applied to another electrode such as an electrode in the electrostatic chuck. In one exemplary embodiment, the second DC generator 32b is configured to be connected to the conductive member of the shower head 13 to generate a second DC signal. The generated second DC signal is applied to the conductive member of the shower head 13. In various embodiments, at least one of the first and second DC signals may be pulsed. The first and second DC generators 32a and 32b may be provided in addition to the RF power source 31, and the first DC generator 32a may be provided in place of the second RF generator 31b.

The exhaust system 40 may be connected to a gas exhaust port 10e provided at the bottom of the plasma processing chamber 10, for example. The exhaust system 40 may include a pressure regulating valve and a vacuum pump. The pressure in the plasma processing space 10s is adjusted by the pressure regulating valve. The vacuum pump may include a turbomolecular pump, a dry pump, or a combination thereof.

The controller 50 processes a computer-executable instruction that causes the substrate processing apparatus 1 to execute various steps described in the present disclosure. The controller 50 is configured to control each element of the substrate processing apparatus 1 to execute the various steps described here. In one exemplary embodiment, a part or all of the controller 50 may be provided as a part of the configuration of an external apparatus of the substrate processing apparatus 1. The controller 50 may include, for example, a computer 50a. The computer 50a may include, for example, a processor (CPU: central processing unit) 50a1, a storage 50a2, and a communication interface 50a3. The processor 50a1 may be configured to perform various control operations based on the program stored in the storage 50a2. The storage 50a2 may include a random access memory (RAM), a read only memory (ROM), a hard disk drive (HDD), a solid state drive (SSD), or a combination thereof. The communication interface 50a3 may communicate with another configuration of the substrate processing apparatus 1 via a communication line such as a local area network (LAN).

In addition to the capacitively coupled plasma (CCP), the plasma formed in the plasma processing space may be an inductively coupled plasma (ICP), an electron-cyclotron-resonance (ECR) plasma, a helicon wave plasma (HWP), a surface wave plasma (SWP) or the like. In addition, various types of plasma generators including an alternating current (AC) plasma generator and a direct current (DC) plasma generator may be used. In one embodiment, the AC signal (AC power) used in the AC plasma generator has a frequency in the range of 100 kHz to 10 GHz. Therefore, the AC signal includes a radio frequency (RF) signal and a microwave signal. In one embodiment, the RF signal has a frequency in the range of 200 kHz to 150 MHz.

Figure 2:
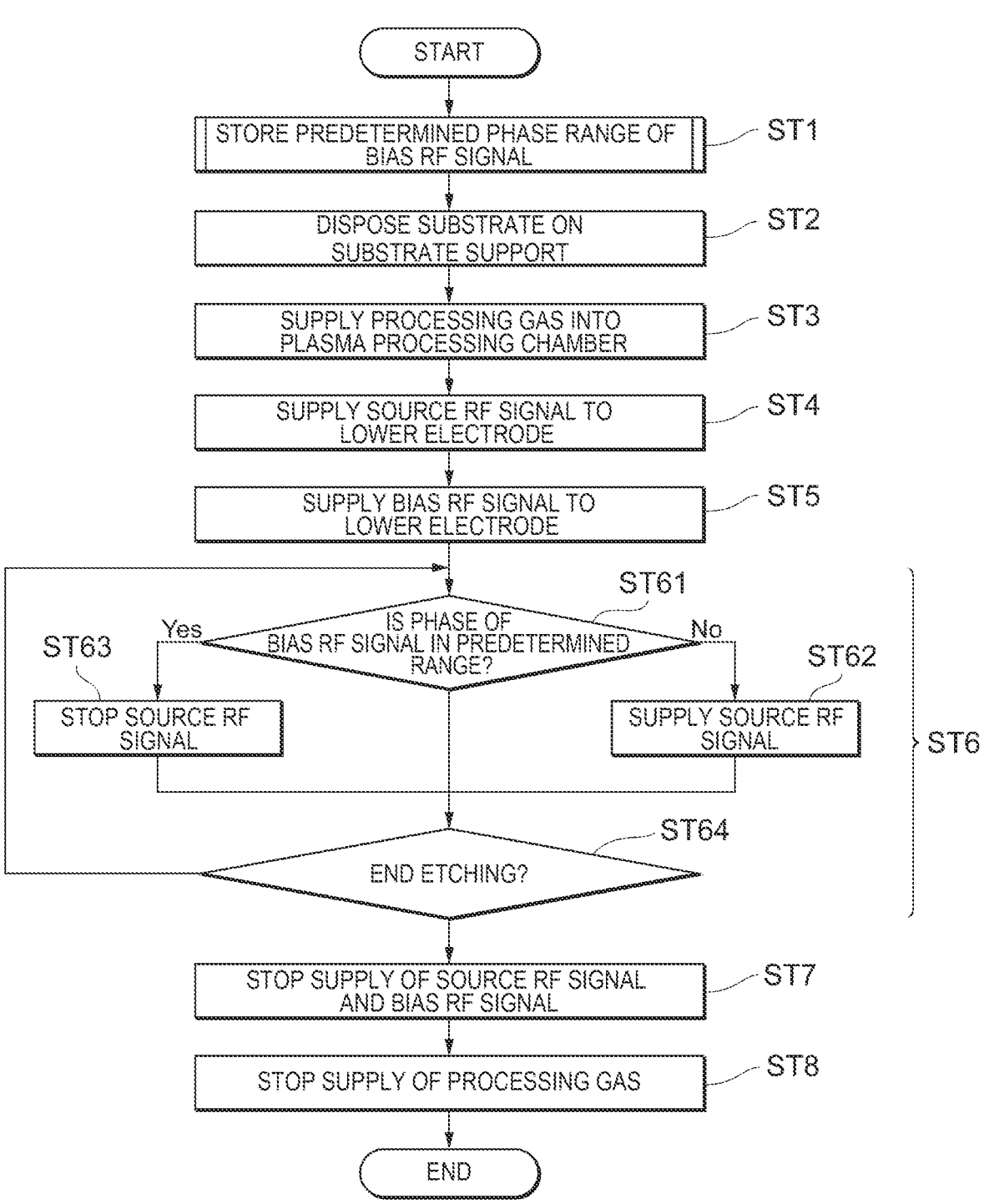
FIG. 2 is a flowchart illustrating a substrate processing method according to one exemplary embodiment.

FIG. 2 is a flowchart illustrating a substrate processing method (hereinafter, also referred to as "the present processing method") according to one exemplary embodiment. The present processing method includes a step of calculating a predetermined phase range of a bias RF signal (ST1), a step of disposing the substrate W on the substrate support 11 (ST2), a step of supplying a processing gas into the plasma processing chamber 10 (ST3), a step of supplying a source RF signal to the lower electrode (ST4), a step of supplying the bias RF signal to the lower electrode (ST5), a step of determining the supply of the source RF signal (ST6), a step of stopping the supply of the source RF signal and the bias RF signal (ST7), and a step of stopping the supply of the processing gas (ST8).

Figure 3:
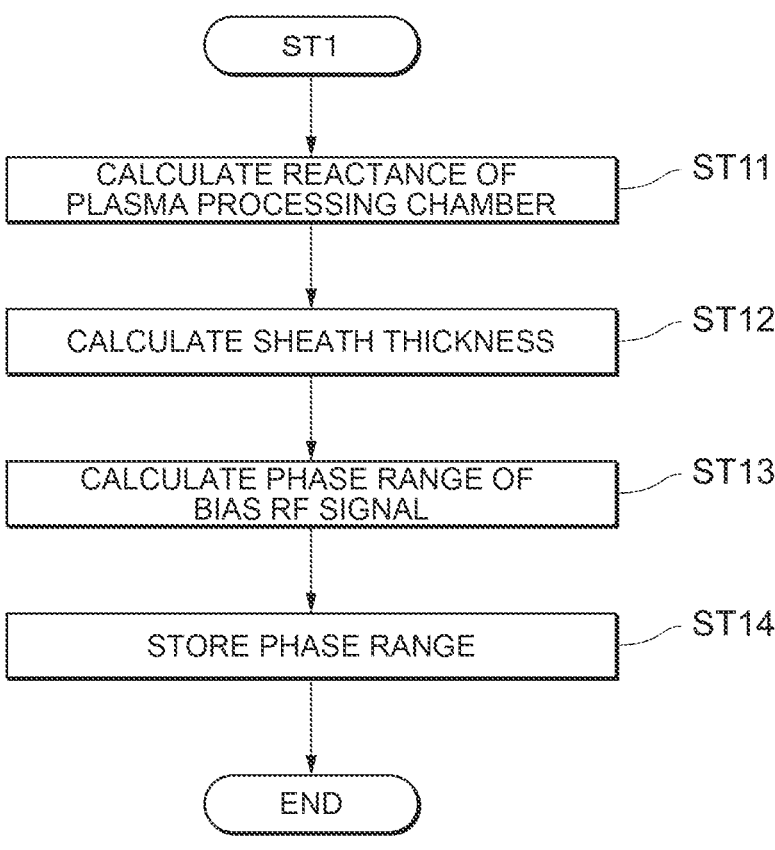
FIG. 3 is a flowchart illustrating an example of each step included in step ST1.

FIG. 3 is a flowchart illustrating an example of each step included in step ST1. Step ST1 includes a step of calculating the reactance of the plasma processing chamber (ST11), a step of calculating the sheath thickness (ST12), a step of calculating a predetermined phase range of the bias RF signal (ST13), and a step of storing the predetermined phase range (ST14).

The present processing method is executed by using, for example, the substrate processing apparatus 1. Each step of the present processing method may be executed by the controller 50 controlling each configuration of the substrate processing apparatus 1. Hereinafter, the present processing method will be described with reference to FIGS. 1 to 3.

In step ST1 (see FIG. 2), the predetermined phase range of the bias RF signal is stored. The predetermined phase range is stored in, for example, the storage 50a2 included in the controller 50. The predetermined phase range may be stored before the processing method is executed, for example, at the time of shipment from the factory or at the time of maintenance of the substrate processing apparatus 1. Further, the predetermined phase range may be calculated and stored as one step of the present processing method. Hereinafter, an example of step ST1 will be described with reference to FIG. 3.

In step ST11, the reactance of the plasma processing chamber 10 is calculated. The reactance may be the reactance of the plasma processing chamber 10 with respect to the substrate W. In addition, the reactance is the reactance corresponding to the peak value of the intensity of the N-fold wave of the source RF signal (an integer of 2 or more, hereinafter, also referred to as "harmonic") or the reactance in the vicinity of the reactance. The peak value may be the maximum value of the intensity of the N-fold wave.

The reactance of the plasma processing chamber 10 is calculated by, for example, the following step. First, the impedance matching circuit included in the first RF generator 31*a* effectively changes the impedance of the plasma processing chamber 10. As a result, the reactance of the N-fold wave of the source RF signal changes with a change in the impedance. Then, the intensity of the N-fold wave in each reactance is measured. Then, the reactance corresponding to the peak value of the intensity of the N-fold wave is calculated.

Figure 4:
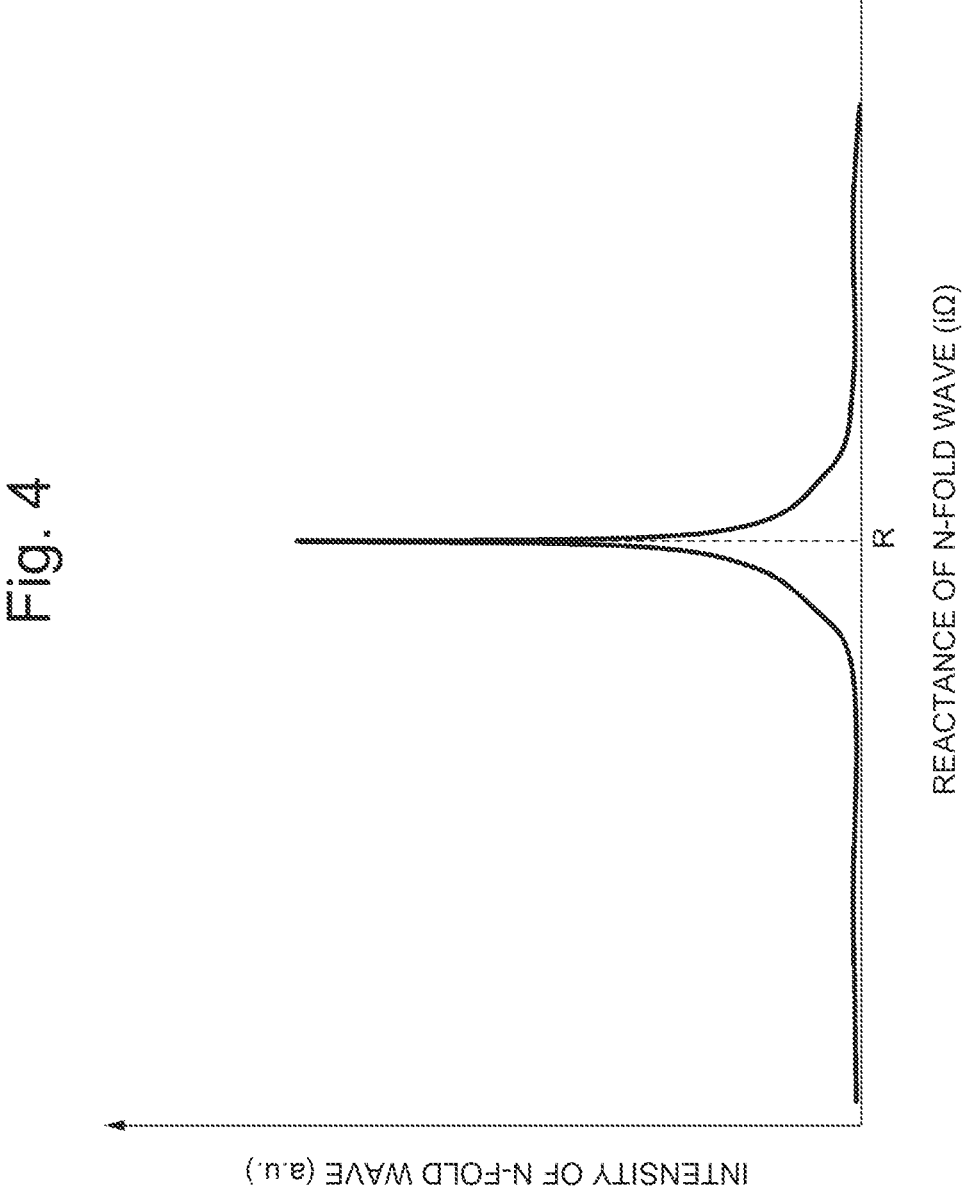
FIG. 4 is a graph obtained by plotting an intensity of an N-fold wave with respect to a reactance of the N-fold wave of a source RF signal.

FIG. 4 is an example of a graph in which the intensity of the N-fold wave is plotted against the reactance of the N-fold wave of the source RF signal. In the graph illustrated in FIG. 4, the horizontal axis represents a reactance (i$\Omega$) of the plasma processing chamber 10 with respect to the substrate W. In step ST11, in this manner, the reactance at which the intensity indicates a peak value may be calculated based on the intensity of the N-fold wave measured for each reactance.

The reactance may be a single value or may be in a predetermined range. In addition, step ST1 of calculating the reactance may be executed prior to the present processing method, for example, at the time of shipment from the factory or at the time of maintenance of the substrate processing apparatus 1. In addition, the reactance may be measured after a plasma is formed in step ST4 of the present processing method.

Hereinafter, an example of step ST12 will be described with reference to FIG. 5.

Figure 5:
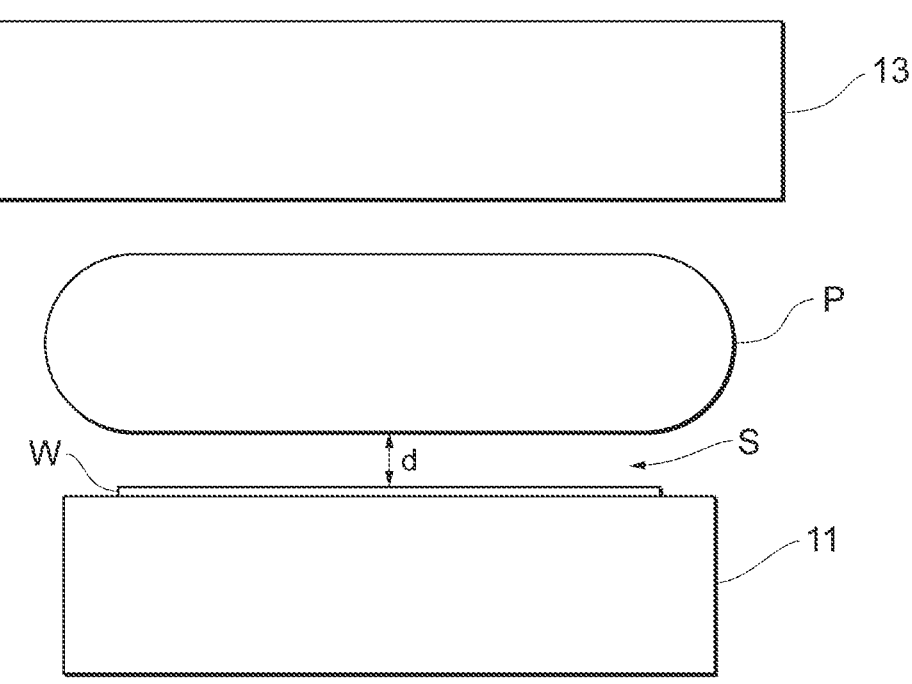
FIG. 5 is a diagram illustrating a sheath S that is formed in a plasma processing chamber 10.

FIG. 5 is a diagram illustrating the sheath S that is formed in the plasma processing chamber 10. When a source RF signal is supplied to the lower electrode (the substrate support 11), a plasma P is formed between the upper electrode (shower head 13) and the lower electrode. The sheath S is a space between the plasma P and the substrate W. In the present embodiment, the thickness of the sheath S is calculated based on the reactance of the plasma processing chamber 10. In other embodiments, the thickness of a sheath formed between the upper electrode and the plasma P may be calculated based on the reactance of the plasma processing chamber 10.

In step ST12 (see FIG. 3), a predetermined sheath thickness d is calculated based on the reactance calculated in step ST11. The sheath thickness d may be calculated based on the thickness of the sheath S when the plasma processing chamber 10 resonates with the sheath S. The sheath thickness d is calculated, for example, based on the following Equation (1).

[Math.1]

$$X - \frac{d}{2\pi f_{HF}\epsilon_0 M} = 0 \qquad \text{Equation (1)}$$

Here, X is the reactance of the plasma processing chamber 10, $f_{HF}$ is the frequency of the source RF signal, Co is the dielectric constant of the vacuum, and M is the area of the substrate W.

The sheath thickness d is not limited to a numerical value calculated based on the theoretical equation as illustrated in Equation (1). The sheath thickness d may be, for example, a numerical value obtained from an empirical rule such as an experimental result and the like, or may be a numerical value obtained based on both an empirical rule and a theory. The sheath thickness d may be a single value or may be in a predetermined range.

In step ST13 (see FIG. 3), a phase range T of the bias RF signal is calculated based on the sheath thickness d calculated in step ST12. The phase range T may be calculated based on, for example, the following Equation (2).

[Math.2]

$$d = \sqrt{\frac{\epsilon_0 v}{2en}} \, (1 - \sin(2\pi f_{LF}t)) \qquad \text{Equation (2)}$$

Here, $\epsilon_0$ is the dielectric constant of the vacuum, V is the maximum voltage of the bias RF signal, e is an elementary electrical charge, n is the electron density in the plasma P near the sheath S, and f LF is the frequency of the bias RF signal, and t is the phase of the bias RF signal.

In a case where the sheath thickness d calculated in step ST12 is in a predetermined range, the phase range T of the bias RF signal may be calculated based on the range of the sheath thickness d. Further, in a case where the sheath thickness d is a single value, the phase range T of the bias RF signal may be calculated based on the sheath thickness d to calculate a predetermined phase t, and then the phase range T of the bias RF signal may be calculated based on the phase t. Further, two or more phase ranges T may be calculated with respect to one cycle of the bias RF signal. In this case, the sheath thickness d corresponding to each of the two or more phase ranges T may be the same thickness.

In step ST14 (see FIG. 3), the phase range T calculated in step ST14 is stored. The phase range T may be stored in the storage 50*a*2 included in the controller 50. The phase range T stored in step ST14 may be a phase range obtained without executing a part or all of step ST11 to step ST14. The phase range T may be, for example, a phase range obtained based only on an empirical rule. Further, the phase range T may be calculated, for example, based on the reactance calculated in step ST11 of step ST11 to step ST14.

In step ST2 (see FIG. 2), the substrate W is disposed on the substrate support 11. The substrate W may be, for example, a substrate in which a underlying film, a film to be etched, a mask film having a predetermined pattern, and the like are stacked on a silicon wafer. The film to be etched is a film that is etched by the present processing method. In addition, the film to be etched may be, for example, a dielectric film, a semiconductor film, a metal film, or the like.

In step ST3, a processing gas is supplied into the plasma processing chamber 10. The processing gas is a gas used for etching the film to be etched that is formed on the substrate W. The type of processing gas may be appropriately selected based on the material of the film to be etched, the material of the mask film, the material of the underlying film, the pattern of the mask film, the etching depth, and the like.

In step ST4, a source RF signal is supplied to the lower electrode included in the main body 111 of the substrate support 11. The source RF signal is an example of a first RF. When a source RF signal is supplied to the lower electrode, a plasma is formed from the processing gas supplied into the plasma processing chamber 10. The frequency of the source RF signal is, for example, 13 MHz to 150 MHz. In addition, in other embodiments, a source RF signal may be supplied to the upper electrode included in the shower head 13.

In step ST5, a bias RF signal is supplied to the lower electrode included in the main body 111 of the substrate support 11. The bias RF signal is an example of a second RF. When a bias RF signal is supplied to the lower electrode, an electric field formed between the lower electrode and the plasma P is controlled by the bias RF signal. Accordingly, the ionic components present in the plasma P or the sheath S (see FIG. 5) and drawn into the substrate W are controlled. The frequency of the bias RF signal is, for example, 400 KHz to 13.56 MHz. In other embodiments, a bias RF signal may be supplied to the upper electrode included in the shower head 13.

When step ST4 and step ST5 are started, etching processing on the substrate W is started by the ionic components generated in the plasma P. The processing may be started at the same time in step ST4 and step ST5. In addition, step ST5 may be started before step ST4. That is, a bias RF signal may be supplied to the lower electrode before a source RF signal.

In step ST6, it is determined whether to continue or stop the supply of the source RF signal. Step ST6 includes a step of determining whether the phase of the bias RF signal is in the predetermined phase range T (ST61), a step of continuing the supply the source RF signal (ST62), a step of stopping the sharing of the source RF signal (ST63), and a step of determining whether to end the etching processing (ST64). Hereinafter, the processing in step ST6 will be described with reference to FIG. 6.

Figure 6:
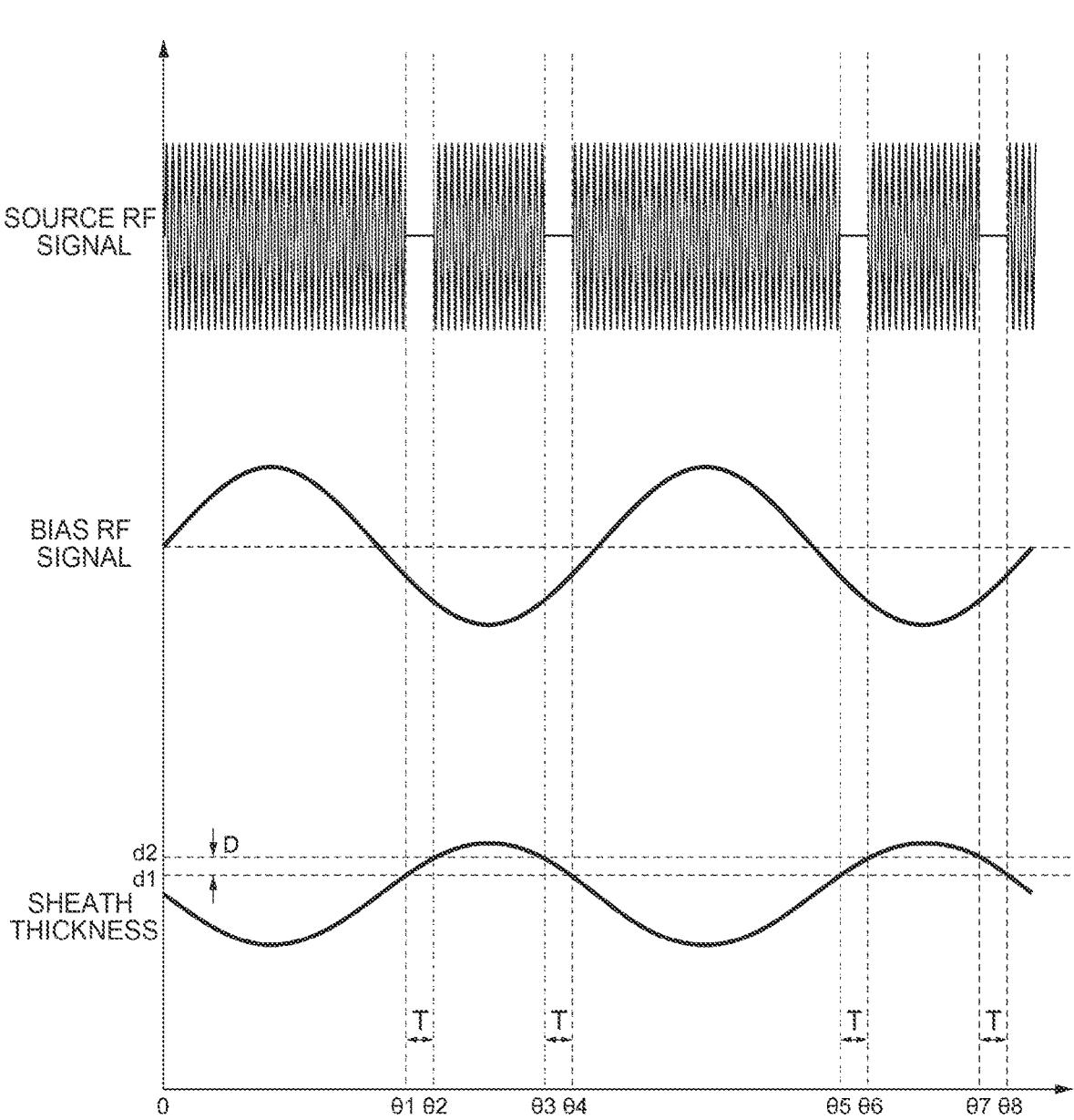
FIG. 6 is a timing chart schematically illustrating an example of changes in a source RF signal, a bias RF signal, and a sheath thickness in the present processing method.

FIG. 6 is a timing chart schematically showing an example of changes in the source RF signal, the bias RF signal, and the sheath thickness in the present processing method. FIG. 6 shows that processing for two cycles of the bias RF signal extracted from the processing continuously performed in step ST6 in the present processing method. In FIG. 6, the horizontal axis represents a phase of the bias RF signal (supply time of the bias RF signal). In addition, the vertical axis represents the power of the source RF signal, the power of the bias RF signal, and the thickness of the sheath S. As illustrated in FIG. 6, the phase of the bias RF signal may be shifted by 180 degrees from the phase of the sheath thickness d.

In the example illustrated in FIG. 6, the phase range T is from an angle θ1 to an angle θ2 (an angle θ5 to an angle θ6) or from an angle θ3 to an angle θ4 (an angle θ7 to an angle θ8). That is, in the example shown in FIG. 6, two phase ranges T are stored in the storage 50a2 for one cycle. Further, a range D of the sheath thickness corresponding to the two phase ranges T is from a thickness d1 to a thickness d2.

In step ST61, it is determined whether the phase of the bias RF signal is in the phase range T. First, the phase range T stored in the storage 50a2 is retrieved. Then, in a case where the current phase t of the bias RF signal is not in the range of the phase range T (No in step ST61), the supply of the source RF signal is continued in step ST62. An example in which the current phase t of the bias RF signal is not in the range of the phase range T is a case where the phase t is in the range of the angle θ or more and less than the angle θ1 or is from the angle θ2 to the angle θ3.

On the other hand, in a case where the current phase t of the bias RF signal is in the range of the phase range T (Yes in step ST61), the supply of the source RF signal is stopped in step ST63. The case where the current phase t of the bias RF signal is in the range of the phase range T is the time, for example, at which the phase t has reached the angle θ1. Further, in a case where the current phase t of the bias RF signal is in a range of the phase range T, for example, the supply of the source RF signal may be limited, such as lowering the power or voltage of the source RF signal below the power or voltage of the source RF signal in a case where the current phase t of the bias RF signal is not in a range of the phase range T.

In step ST62 or step ST63, after the supply of the source RF signal is continued or stopped, it is determined in step ST64 whether to end the etching processing. When it is determined that the etching process is to be continued (No in step ST64), the supply or stop of the source RF signal is continued, and the processing returns to step ST61 to be continued.

By repeating the above operation in step ST6, the supply of the source RF signal is controlled according to the phase t of the bias RF signal. That is, when the phase t of the bias RF signal is not in the phase range T, both the source RF signal and the bias RF signal are supplied to the lower electrode. On the other hand, when the phase t of the bias RF signal is in the phase range T, the supply of the source RF signal is stopped, and only the bias RF signal is supplied to the lower electrode.

Then, in step ST64, when it is determined that the etching processing is to be ended (Yes in step ST64), the supply of the source RF signal and the bias RF signal is stopped in step ST7. In addition, in step ST8, the supply of the processing gas is stopped, and the present processing method is ended.

According to one exemplary embodiment of the present disclosure, a source RF signal and a bias RF signal are supplied to the lower electrode (or the upper electrode) in a sheath thickness or a phase of the bias RF signal at which the plasma processing chamber 10 and the sheath S do not resonate. For example, the supply of the source RF signal is restricted or stopped in a sheath thickness or a phase of a bias RF signal at which the plasma processing chamber 10 and the sheath S resonate. By controlling the supply of the source RF signal in this manner, it is possible to suppress excitation of a harmonic of the source RF signal. Accordingly, it is possible to provide a substrate processing method having good in-plane uniformity of the etching rate.

The present disclosure provides a plasma processing method with good in-plane uniformity.

Each of the above embodiments is described for the purpose of description, and various modifications can be made without departing from the scope and purpose of the present disclosure. For example, the present processing method can be executed by using the substrate processing apparatus 1 that uses an arbitrary plasma source, such as an inductively coupled plasma or a microwave plasma, besides the capacitively coupled substrate processing apparatus 1.

What is claimed is:

1. A plasma processing method for performing plasma processing to a substrate in a plasma processing apparatus, the plasma processing apparatus including a chamber, a substrate support that is provided in the chamber, includes a lower electrode, and is configured to support the substrate, and an upper electrode that is provided in the chamber to face the lower electrode, the substrate support being provided between the upper electrode and the lower electrode, the plasma processing method comprising:

disposing a substrate on the substrate support;

supplying, into the chamber, a processing gas for processing the substrate;

forming a plasma from the processing gas between the upper electrode and the lower electrode by supplying a first radio frequency (RF) having a first frequency to the upper electrode or the lower electrode; and controlling an electric field formed between the upper electrode or the lower electrode and the plasma by supplying a second RF having a second frequency lower than the first frequency to the upper electrode or the lower electrode, wherein forming the plasma includes controlling the supply of the first RF based on a phase of the second RF, wherein controlling the supply of the first RF comprises:

forming a plasma by supplying the first RF to the upper electrode or the lower electrode with a first power, and suppressing the forming of the plasma by supplying the first RF to the upper electrode or the lower electrode with a second power lower than the first power based on a phase of the second RF, wherein in suppressing the forming of the plasma, when the phase of the second RF is in one or more phase ranges, the first RF is supplied to the upper electrode or the lower electrode with the second power, wherein the one or more phase ranges are based on a thickness of a sheath formed between the upper electrode or the lower electrode and the plasma, at which the sheath resonates with the chamber.

2. The plasma processing method according to claim 1, wherein in suppressing the forming of the plasma, the first RF is supplied with the second power in two of the phase ranges.

3. The plasma processing method according to claim 2, wherein the plasma processing apparatus includes a controller, the plasma processing method further comprises:

storing the one or more phase ranges in the controller, and in controlling the supply of the first RF, the supply of the first RF is controlled based on the one or more phase ranges stored in the controller.

4. The plasma processing method according to claim 1, wherein the plasma processing apparatus includes a controller, the plasma processing method further comprises:

storing the one or more phase ranges in the controller, and in controlling the supply of the first RF, the supply of the first RF is controlled based on the one or more phase ranges stored in the controller.

5. A plasma processing method for performing plasma processing to a substrate in a plasma processing apparatus, the plasma processing apparatus including a chamber, a substrate support that is provided in the chamber, includes a lower electrode, and is configured to support the substrate, and an upper electrode that is provided in the chamber to face the lower electrode, the substrate support being provided between the upper electrode and the lower electrode, the plasma processing method comprising:

disposing a substrate on the substrate support;

supplying, into the chamber, a processing gas for processing the substrate;

forming a plasma from the processing gas between the upper electrode and the lower electrode by supplying a first radio frequency (RF) having a first frequency to the upper electrode or the lower electrode;

controlling an electric field formed between the upper electrode or the lower electrode and the plasma by supplying a second RF having a second frequency lower than the first frequency to the upper electrode or the lower electrode; and calculating a reactance of the chamber with respect to a harmonic of the first RF, wherein forming the plasma includes controlling the supply of the first RF based on a phase of the second RF, wherein the controlling the supply of the first RF including forming a plasma by supplying the first RF to the upper electrode or the lower electrode with a first power, and suppressing the forming of the plasma by supplying the first RF to the upper electrode or the lower electrode with a second power lower than the first power based on a phase of the second RF, wherein in suppressing the forming of the plasma, when the phase of the second RF is in one or more phase ranges, the first RF is supplied to the upper electrode or the lower electrode with the second power, wherein the one or more phase ranges are calculated based on the calculated reactance, wherein in controlling the supply of the first RF, the supply of the first RF is controlled based on the calculated one or more phase ranges.

6. The plasma processing method according to claim 5, wherein in suppressing the forming of the plasma, the first RF is supplied with the second power in two of the phase ranges.

7. The plasma processing method according to claim 6, wherein the plasma processing apparatus includes a controller, the plasma processing method further comprises:

storing the one or more phase ranges in the controller, and in controlling the supply of the first RF, the supply of the first RF is controlled based on the one or more phase ranges stored in the controller.

8. The plasma processing method according to claim 5, wherein the plasma processing apparatus includes a controller, the plasma processing method further comprises:

storing the one or more phase ranges in the controller, and in controlling the supply of the first RF, the supply of the first RF is controlled based on the one or more phase ranges stored in the controller.

9. A plasma processing apparatus that performs plasma processing to a substrate, the apparatus comprising:

a chamber;

a substrate support that is provided in the chamber, includes a lower electrode, and is configured to support the substrate;

an upper electrode that is provided in the chamber to face the lower electrode, the substrate support being provided between the upper electrode and the lower electrode; and a controller, wherein the controller executes a control of disposing a substrate on the substrate support, supplying, into the chamber, a processing gas for processing the substrate, forming a plasma from the processing gas between the upper electrode and the lower electrode by supplying a first radio frequency (RF) having a first frequency to the upper electrode or the lower electrode, controlling an electric field formed between the upper electrode or the lower electrode and the plasma by supplying a second RF having a second frequency lower than the first frequency to upper electrode or the lower electrode, and controlling the supply of the first RF based on a phase of the second RF in the forming of the plasma, calculating a reactance of the chamber with respect to a harmonic of the first RF, and calculating one or more phase ranges based on the calculated reactance wherein controlling the supply of the first RF including forming a plasma by supplying the first RF to the upper electrode or the lower electrode with a first power, and suppressing the forming of the plasma by supplying the first RF to the upper electrode or the lower electrode with a second power lower than the first power based on a phase of the second RF, wherein in suppressing the forming of the plasma, when the phase of the second RF is in the one or more phase ranges, the first RF is supplied to the upper electrode or the lower electrode with the second power, wherein in controlling the supply of the first RF, the supply of the first RF is controlled based on the one or more phase ranges.

10. A plasma processing apparatus that performs plasma processing to a substrate, the apparatus comprising:

a chamber;

a substrate support that is provided in the chamber, includes a lower electrode, and is configured to support the substrate;

an upper electrode that is provided in the chamber to face the lower electrode, the substrate support being provided between the upper electrode and the lower electrode; and a controller, wherein the controller executes a control of disposing a substrate on the substrate support, supplying, into the chamber, a processing gas for processing the substrate, forming a plasma from the processing gas between the upper electrode and the lower electrode by supplying a first radio frequency (RF) having a first frequency to the upper electrode or the lower electrode, controlling an electric field formed between the upper electrode or the lower electrode and the plasma by supplying a second RF having a second frequency lower than the first frequency to upper electrode or the lower electrode, and controlling the supply of the first RF based on a phase of the second RF in the forming of the plasma, wherein controlling the supply of the first RF including forming a plasma by supplying the first RF to the upper electrode or the lower electrode with a first power, and suppressing the forming of the plasma by supplying the first RF to the upper electrode or the lower electrode with a second power lower than the first power based on a phase of the second RF, wherein in suppressing the forming of the plasma, when the phase of the second RF is in one or more phase ranges, the first RF is supplied to the upper electrode or the lower electrode with the second power, and wherein the one or more phase ranges are based on a thickness of a sheath formed between the upper electrode or the lower electrode and the plasma, at which the sheath resonates with the chamber.

*  *  *  *  *